US012181762B2

(12) United States Patent
Hao et al.

(10) Patent No.: US 12,181,762 B2
(45) Date of Patent: Dec. 31, 2024

(54) DISPLAY PANEL AND DISPLAY SCREEN

(71) Applicants: Mianyang HKC Optoelectronics Technology Co., Ltd., Sichuan (CN); HKC Corporation Limited, Guangdong (CN)

(72) Inventors: Jingjing Hao, Sichuan (CN); Rongrong Li, Sichuan (CN)

(73) Assignees: MIANYANG HKC OPTOELECTRONICS TECHNOLOGY CO., LTD., Sichuan (CN); HKC CORPORATION LIMITED, Guangdong (CN)

( * ) Notice: Subject to any disclaimer, the term of this patent is extended or adjusted under 35 U.S.C. 154(b) by 111 days.

(21) Appl. No.: 18/089,951

(22) Filed: Dec. 28, 2022

(65) Prior Publication Data

US 2023/0341733 A1  Oct. 26, 2023

(30) Foreign Application Priority Data

Apr. 21, 2022 (CN) .......................... 202210422269.3

(51) Int. Cl.
  *G09G 3/34* (2006.01)
  *G02F 1/1333* (2006.01)
  (Continued)

(52) U.S. Cl.
  CPC .... *G02F 1/13629* (2021.01); *G02F 1/133345* (2013.01); *G09G 3/3406* (2013.01); *H01L 27/1248* (2013.01); *H01L 27/124* (2013.01)

(58) Field of Classification Search
  CPC ........... G02F 1/13629; G02F 1/133345; G02F 1/13454; G02F 1/1345; G02F 1/13458;
  (Continued)

(56) References Cited

U.S. PATENT DOCUMENTS

2002/0067452 A1  6/2002 Sakamoto et al.
2007/0139600 A1*  6/2007 Lee ..................... G02F 1/13454
                                                    349/153

(Continued)

FOREIGN PATENT DOCUMENTS

CN       106802507 A    6/2017
CN       107479227 A   12/2017
(Continued)

OTHER PUBLICATIONS

International Search Report dated Mar. 3, 2023 received in International Application No. PCT/CN2022/137260.

*Primary Examiner* — Pegeman Karimi (74) *Attorney, Agent, or Firm* — Scully, Scott, Murphy & Presser, P.C.

(57) ABSTRACT

A display panel and a display screen are provided in the disclosure. The display panel includes a transmission unit and a display unit electrically coupled with the transmission unit. The transmission unit is configured to transmit a driving signal to the display unit. The transmission unit includes a first wiring layer, a second wiring layer, and a dielectric layer. The dielectric layer is located between the first wiring layer and the second wiring layer. The first wiring layer is provided with first wires. The second wiring layer is provided with second wires. The first wires have first parts. Projections of the first parts on the dielectric layer overlap projections of the second wires on the dielectric layer. The first wires are electrically coupled with the display unit via the second wires. The first parts define at least one first space.

20 Claims, 9 Drawing Sheets

(51) Int. Cl.
*G02F 1/1362* (2006.01)
*H01L 27/12* (2006.01)

(58) Field of Classification Search
CPC . G09G 3/3406; H01L 27/1248; H01L 27/124;
H01L 27/1244
See application file for complete search history.

(56) References Cited

U.S. PATENT DOCUMENTS

| | | | | |
|---|---|---|---|---|
| 2011/0116019 A1* | 5/2011 | Hwang | ............... | G02F 1/13452 |
| | | | | 349/84 |
| 2022/0011617 A1* | 1/2022 | Lee | .................... | G02F 1/13456 |
| 2022/0148481 A1* | 5/2022 | Park | ........................ | G09G 3/20 |

FOREIGN PATENT DOCUMENTS

| | | |
|---|---|---|
| CN | 109298576 A | 2/2019 |
| CN | 109407435 A | 3/2019 |
| CN | 109491161 A | 3/2019 |
| CN | 111384066 A | 7/2020 |
| CN | 211238253 U | 8/2020 |
| CN | 114740664 A | 7/2022 |
| WO | 2020210932 A1 | 10/2020 |

* cited by examiner

DISPLAY PANEL AND DISPLAY SCREEN

CROSS-REFERENCE TO RELATED APPLICATION(S)

This application claims priority to Chinese Patent Application No. 202210422269.3, filed Apr. 21, 2022, the entire disclosure of which is hereby incorporated by reference.

TECHNICAL FIELD

This disclosure relates to the field of display device technology, and more particularly to a display panel and a display screen.

BACKGROUND

With the increasing demand for display screens with large sizes and narrow bezels, Gate Driver Less (GDL) display panels are becoming more and more popular. However, in panels with large-sizes and Ultra High Definition (UHD), increased sizes of GDL wires leads to larger capacitive and resistance loads of the panels, and thus display performances of the panels are affected.

SUMMARY

In a first aspect, a display panel is provided in the disclosure. The display panel includes a transmission unit and a display unit. The transmission unit is electrically coupled with the display unit. The transmission unit is configured to transmit a driving signal to the display unit. The transmission unit includes a first wiring layer, a second wiring layer, and a dielectric layer. The dielectric layer is located between the first wiring layer and the second wiring layer. The first wiring layer is provided with M first wires. The second wiring layer is provided with N second wires. The M first wires have L first parts. Projections of the L first parts on the dielectric layer overlap projections of the second wires on the dielectric layer. The first wires are electrically coupled with the display unit via the second wires. M, N, and L each are an integer greater than or equal to 1. The L first parts define at least one first space. The display unit is configured to receive the driving signal from the transmission unit and display an image according to the driving signal.

In a second aspect, a display screen is provided in the disclosure. The display screen includes a backlight module and the display panel of the first aspect. The backlight module is configured to provide a backlight source for the display panel.

BRIEF DESCRIPTION OF THE DRAWINGS

To illustrate technical solutions of embodiments of the disclosure or in the related art more clearly, the following will give a brief introduction to accompanying drawings used for illustrating embodiments or the related art. Apparently, the accompanying drawings hereinafter illustrated are some embodiments of the disclosure. Based on these drawings, those of ordinary skill in the art can also obtain other drawings without creative effort.

DETAILED DESCRIPTION

The following will illustrate clearly and completely technical solutions of implementations of the disclosure with reference to the accompanying drawings of implementations of the disclosure. Apparently, implementations described herein are merely some rather than all implementations of the disclosure. Based on the implementations of the disclosure, all other implementations obtained by those of ordinary skill in the art without creative effort shall fall within the protection scope of the disclosure.

Unless otherwise defined, all technical and scientific terms used herein have the same meaning as commonly understood by those skilled in the art of the present disclosure. The terms used herein in the disclosure are for the purpose of describing implementations only and are not intended to limit the disclosure. The term "and/or" used herein includes any and all combinations of one or more related listed items.

It is to be noted that, if a component is considered to be "connected" to another component, the component may be directly connected to the another component or the two components may have an intermediate component therebetween.

The following will illustrate in detail specific implementations of the disclosure with reference to the accompanying drawings.

Figure 1:
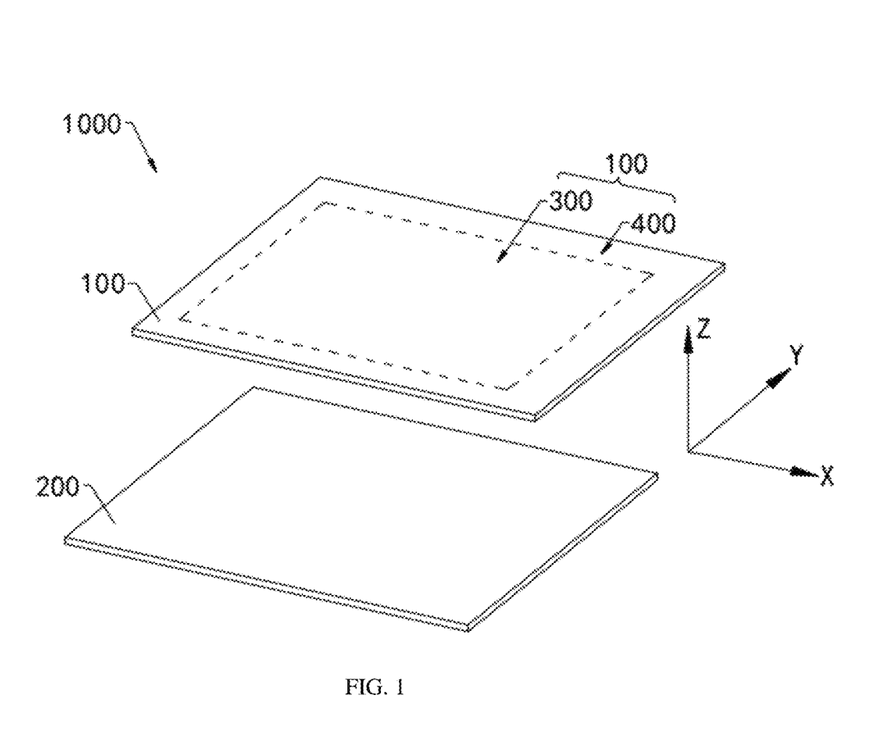
FIG. 1 is a schematic structural diagram illustrating a display screen provided in an implementation of the embodiment.

Referring to FIG. 1, FIG. 1 is a schematic structural diagram illustrating a display screen 1000 provided in an implementation of the embodiment. The display screen 1000 includes a display panel 100 and a backlight module 200. The backlight module 200 is configured to provide a light source for the display panel 100, such that the display panel 100 displays an image.

The display screen 1000 may be a Liquid Crystal Display (LCD), an Organic Light-Emitting Diode (OLED) display screen, a White-OLED (W-OLED) display screen, a Quantum Dot LED (QLED) display screen, a plasma display screen, a curved display, or display screens of other types. An LCD 1000 is taken as an example of the display screen 1000 of the embodiment illustrated in FIG. 1 for illustration. The LCD panel 100 may include a Color Filter (CF) substrate, a Thin Film Transistor (TFT) substrate, a frame adhesive, and a liquid crystal.

Referring to FIG. 1 again, the display panel 100 includes a display unit 300 and a non-display unit 400. The non-display unit 400 is located around the display unit 300. The display unit 300 is configured to display an image.

Figure 2:
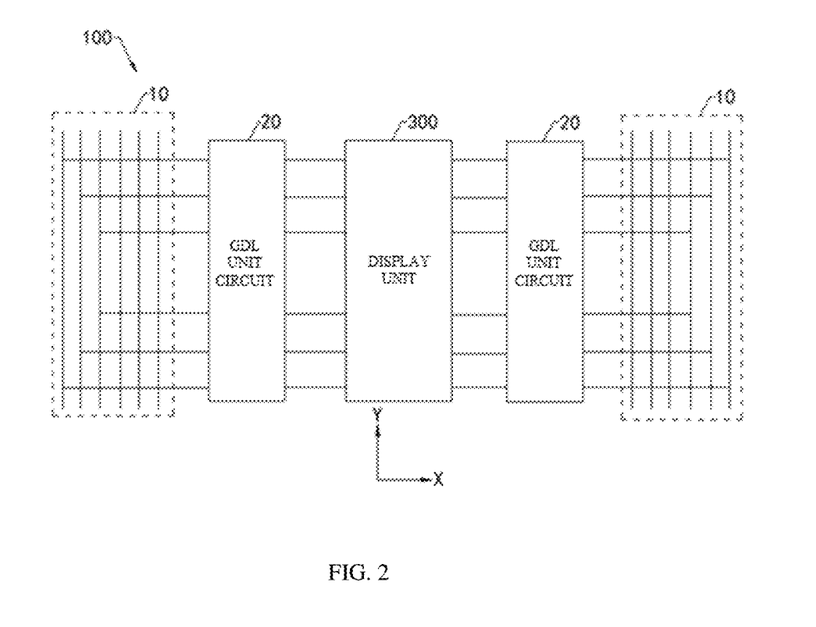
FIG. 2 is a schematic diagram illustrating a transmission path of a driving signal in a display panel.

Referring to FIG. 2, FIG. 2 is a schematic diagram illustrating a transmission path of a driving signal in the display panel 100. The display panel 100 further includes a transmission unit 10 and a Gate Driver Less (GDL) unit circuit 20. The transmission unit 10 and the GDL unit circuit 20 each are disposed in the non-display unit 400. The transmission unit 10 is configured to transmit a driving signal of the display panel 100. The transmission unit 10 is electrically coupled with the GDL unit circuit 20. The GDL unit circuit 20 is electrically coupled with the display unit 300.

In the display panel 100 driven by GDL, the transmission unit 10 is configured to transmit a logical signal to the GDL unit circuit 20, and the GDL unit circuit 20 outputs a scanning signal to an LCD panel according to the received signal, such that the display unit 300 can display an image.

The number of the transmission unit(s) 10 may be the same as or different from that of the GDL unit circuit(s) 20. In the implementation, the display panel 100 adopts a double-sided GDL driving manner. That is, there are two the transmission units 10 and two GDL unit circuits 20, the two transmission units 10 are located at two opposite sides of the display unit 300 respectively, and the two GDL unit circuits 20 are located at the two opposite sides of the display unit 300 respectively. In this way, one of the two transmission units 10 in one side transmits a corresponding driving signal to the GDL unit circuit 20 at the same side, and simultaneously the other transmission unit 10 transmits a corresponding driving signal to the other GDL unit circuit 20 at the other side, such that signal transmission efficiency is higher, which is conducive to improving a display performance of the display panel 100. In an implementation, there may also be one transmission unit 10 and one GDL unit circuit 20. In an implementation, there may also be more than two transmission units 10 and more than two GDL unit circuits 20.

In the implementation, the transmission unit 10 and the GDL unit circuit 20 provide transverse drive (i.e., gate drive) for the display panel 100. In other implementations, the transmission unit 10 and the GDL unit circuit 20 can also provide source drive for the display panel 100.

The transmission unit 10 includes one or more of a Clock (CLK) signal wire, a Start Vertical (STV) signal wire, a Reset (RST) signal wire, and a Vgatelow (VGL) signal wire.

Figure 3:
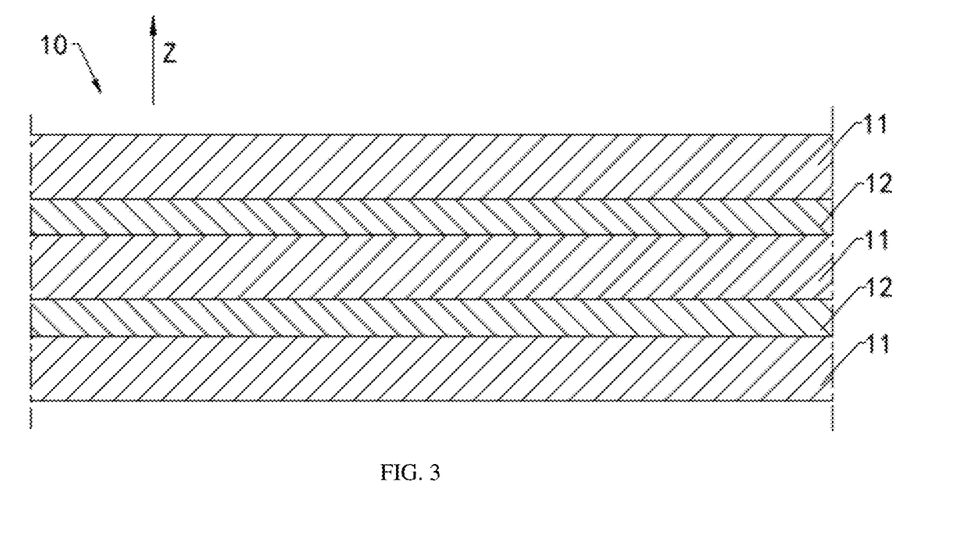
FIG. 3 is a schematic cross-sectional structural view of a transmission unit in a Z direction.

Referring to FIG. 3, FIG. 3 is a schematic cross-sectional structural view of a transmission unit 10 in a Z direction. The transmission unit 10 includes multiple wiring units 11 and at least one insulating layer 12. The at least one insulating layer 12 and the multiple wiring units 11 are alternately stacked in sequence, and the at least one insulating layer 12 is located between two adjacent wiring units 11, such that the two adjacent wiring units 11 are insulated from each other. In other implementations, the transmission unit 10 may also include only one wiring unit 11 without the insulating layer 12.

The at least one insulating layer 12 is filled with an insulating material, where the insulating material may be a common dielectric constant material such as Silicon Dioxide ($SiO_2$), and may also be a Low dielectric constant (low-k, LK) material, a Ultra Low-K (ULK) material, or an Extreme Low-K (ELK) material.

Figure 4:
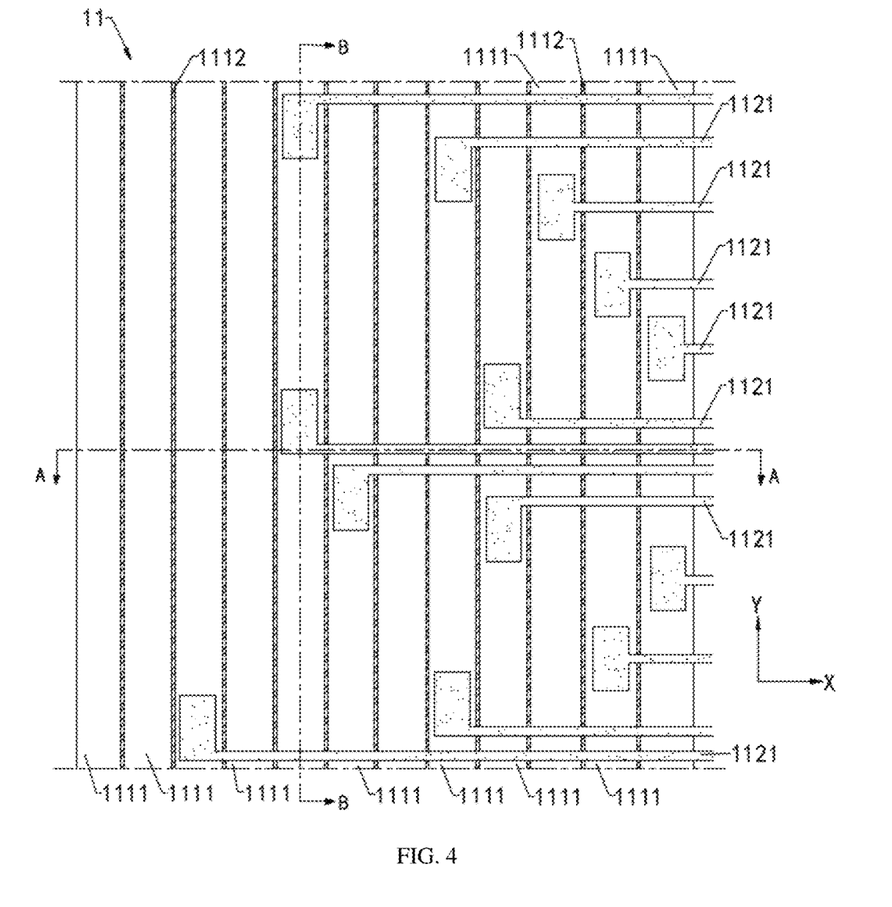
FIG. 4 is a schematic structural diagram illustrating a part of a wiring unit in the related art.
Figure 5:
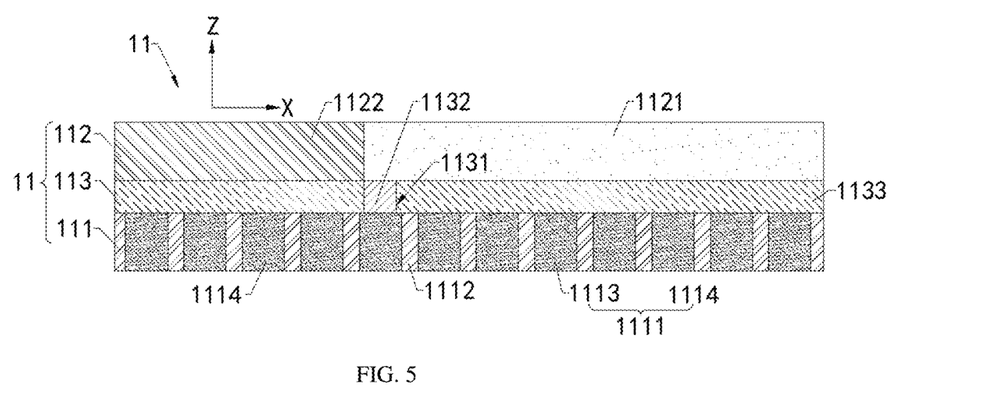
FIG. 5 is a schematic cross-sectional structural view of the wiring unit illustrated in FIG. 4, along line A-A.

Referring to FIG. 4 and FIG. 5, FIG. 4 is a schematic structural diagram illustrating a part of a wiring unit 11 in the related art, and FIG. 5 is a schematic cross-sectional structural view of the wiring unit 11 illustrated in FIG. 4, along line A-A. The wiring unit 11 includes a first wiring layer 111, a second wiring layer 112, and a dielectric layer 113 that are stacked. The dielectric layer 113 is disposed between the first wiring layer 111 and the second wiring layer 112. Each of the number of the first wiring layer 111, the number of the second wiring layer 112, and the number of the dielectric layer 113 is one.

Referring to FIG. 5 again, the first wiring layer 111 is provided with M first wires 1111 and a first insulating medium 1112, where the first wires 1111 are electrically coupled with a driving circuit board. The M first wires 1111 are arranged at intervals, and the first insulating medium 1112 is filled between the M first wires 1111, such that the M first wires 1111 are insulated from each other. M is an integer greater than or equal to 1. The M first wires 1111 include one or more of a CLK signal wire, an STV signal wire, an RST signal wire, and a VGL signal wire.

Referring to FIG. 5 again, the second wiring layer 112 is provided with N second wires 1121 and a second insulating medium 1122, where each of the N second wires 1121 is electrically coupled with one of the first wires 1111 at one end and electrically coupled with the GDL unit circuit 20 at the other end. The N second wires 1121 are arranged at intervals, and the second insulating medium 1122 is filled between the N second wires 1121, such that the N second wires 1121 are insulated from each other. N is an integer greater than or equal to 1.

In an implementation, the first wires 1111 at a same layer have a same extending direction and are parallel arranged at intervals. The second wires 1121 at a same layer have a same extending direction and are parallel arranged at intervals. Moreover, projections of the extending direction of the first wires 1111 on the dielectric layer 113 and projections of the extending direction of the second wires 1121 on the dielectric layer 113 intersect at a certain included angle.

In the implementation, moreover, the projections of the extending direction of the first wires 1111 on the dielectric layer 113 is perpendicular to the projections of the extending direction of the second wires 1121 on the dielectric layer 113.

Referring to FIG. 5 again, the dielectric layer 113 defines H through holes 1131, where the H through holes 1131 are arranged at intervals. Conducting materials are disposed in the through holes 1131. The through holes 1131 extend through the dielectric layer 113, with one end in communication with the first wires 1111 and the other end in communication with the second wires 1121. The first wires 1111 are electrically coupled with the second wires 1121 via the through holes 1131. In an implementation, conducting materials are disposed in the through holes 1131 to form metal columns 1132. The metal columns 1132 are coupled with the first wires 1111 at one end and coupled with the second wires 1121 at the other end. In other implementations, conducting materials are disposed only at inner walls of the through holes 1131. H is an integer greater than or equal to 1.

Referring to FIG. 5 again, the dielectric layer 113 further includes a third insulating medium 1133, and the third insulating medium 1133 is filled between the H through holes 1131, such that the through holes 1131 are insulated from each other. The third insulating medium 1133 can also insulate the first wiring layer 111 from the second wiring layer 112. In this way, the first wires 1111 are electrically coupled with the second wires 1121 via the metal columns 1132. The second wires 1121 are electrically coupled with a driving unit. In the implementation, a driving signal of the display screen 1000 is finally arrived at the display unit 300 by sequentially passing through the first wire 1111, the metal column 1132, the second wire 1121, and the GDL unit circuit 20.

In an implementation, one first wire 1111 is electrically coupled with one second wire 1121 via only one through hole 1131. That is to say, the first wire 1111, the second wire 1121, and the through hole 1131 have a one-to-one correspondence with one other. In other implementations, two first wires 1111 are electrically coupled with a same second wire 1121 via two through holes 1131. Optionally, two second wires 1121 are electrically coupled with a same first wire 1111 via two through holes 1131.

In addition, different wiring units 11 have the same or different number of the first wires 1111, the second wires 1121, and the through holes 1131, which can be flexibly set by those skilled in the art according to needs.

The first wires 1111, the second wires 1121, and the metal column 1132 each can be made of various metals such as Copper (Cu), Aluminum (Al), Tungsten (W), Cobalt (Co), Argentum (Ag), Aurum (Au), Ruthenium (Ru), or Nickel (Ni), or an alloy thereof. The first wires 1111, the second wires 1121, and the metal column 1132 may be made of the same or different materials. In the implementation, the first wires 1111 and the second wires 1121 are Cu wires, and the metal columns 1132 are Cu columns. In an implementation, the first wires 1111 and the second wires 1121 are Cu wires, and the metal columns 1132 are Co columns. In an implementation, the first wires 1111 are Cu wires, the second wires 1121 are Al wires, and the metal columns 1132 are Co columns.

The first insulating medium 1112, the second insulating medium 1122, and the third insulating medium 1133 each may be common dielectric constant materials such as $SiO_2$ and may also be LK materials, ULK materials, or ELK materials, to reduce parasitic capacitances between metal wires and interconnection line delay of circuits. The first insulating medium 1112, the second insulating medium 1122, and the third insulating medium 1133 may be made of the same or different materials, to satisfy requirements on the transmission unit 10 in terms of many aspects such as parasitic capacitance, mechanical strength, and reliability. In the implementation, the first insulating medium 1112, the second insulating medium 1122, and the third insulating medium 1133 are made of the same material. It can be understood that, due to consistent performances of the same material, cracks among the first wiring layer 111, the second wiring layer 112, and the third dielectric layer 113 will be not easily occurred under action of an external force, and thus the wiring unit 11 has a better overall strength.

Figure 6:
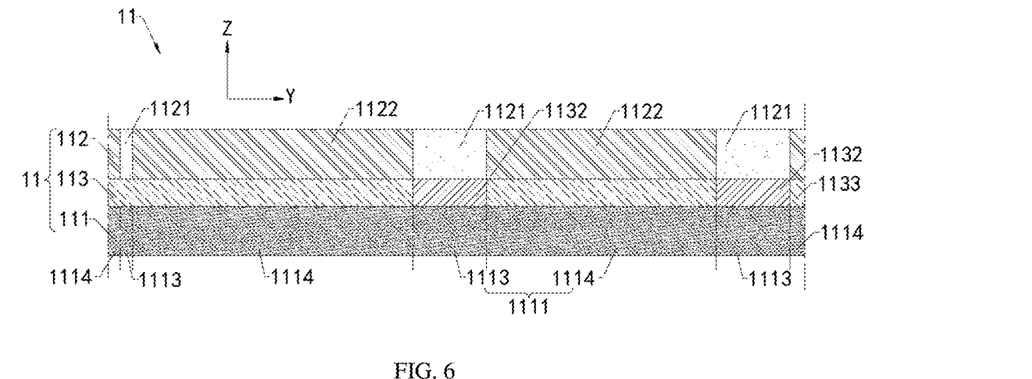
FIG. 6 is a schematic cross-sectional structural view of the wiring unit illustrated in FIG. 4, along line B-B.

Referring to FIG. 6, FIG. 6 is a schematic cross-sectional structural view of the wiring unit 11 illustrated in FIG. 4, along line B-B. The M first wires 1111 have L first parts 1113 and K second parts 1114. The first parts 1113 are connected with the second parts 1114. The L first parts 1113 are arranged at intervals. The K second parts 1114 are arranged at intervals. Projections of the L first parts 1113 on the dielectric layer 113 overlap projections of the second wires 1121 on the dielectric layer 113. Projections of the K second parts 1114 on the dielectric layer 113 and the projections of the second wires 1121 on the dielectric layer 113 are non-overlapping. It can be understood that, the first parts 1113 are overlapping parts between projections of the second wires 1121 on the first wiring layer 111 and the first wires 1111. L and K each are an integer greater than or equal to 1.

In an implementation, there are multiple first wires 1111, and each of the M first wires 1111 has a first part(s) 1113. In an implementation, there are multiple first wires 1111, some of the M first wires 1111 each have a first part(s) 1113, and the others have no first part 1113. Furthermore, each of the M first wires 1111 can have the same or different number of first parts 1113.

Figure 7:
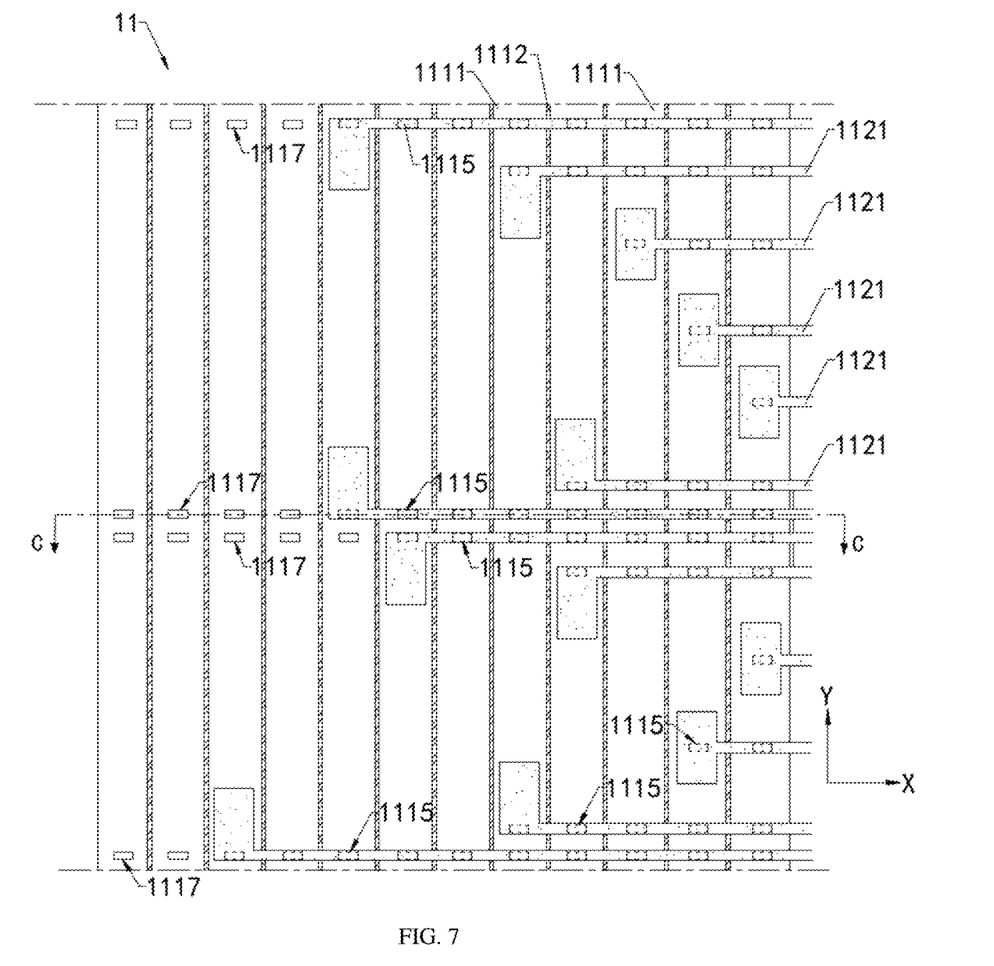
FIG. 7 is a schematic diagram illustrating a wiring unit in an implementation of the disclosure.
Figure 8:
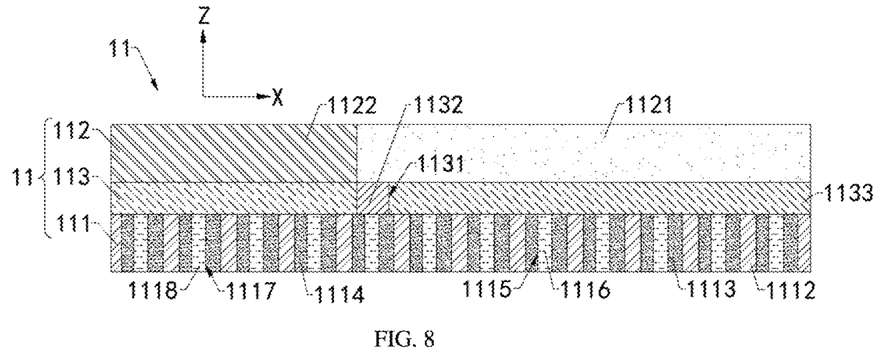
FIG. 8 is a schematic cross-sectional structural view of the wiring unit illustrated in FIG. 7, along line C-C.

Referring to FIG. 7 and FIG. 8, FIG. 7 is a schematic diagram illustrating a wiring unit 11 in an implementation of the disclosure, and FIG. 8 is a schematic cross-sectional structural view of the wiring unit 11 illustrated in FIG. 7, along line C-C. The L first parts 1113 define at least one first space 1115. It can be understood that, the L first parts 1113 can define one first space 1115 and can also define multiple first spaces 1115. The multiple first spaces 1115 are arranged at intervals. Arrangement of the first spaces 1115 reduces capacitances between the first wires 1111 and the second wires 1121 and a resistance-capacitance of the transmission unit, such that the display panel has an improved display performance.

In an implementation, there are multiple first parts 1113 and multiple first spaces 1115. Each of the first parts 1113 defines one first space 1115. In an implementation, there are multiple first parts 1113, and the multiple first parts 1113 define one first space 1115. That is to say, there is no first space 1115 defined in L-1 first parts 1113.

Furthermore, one first part 1113 can define one first space 1115 and can also define multiple first spaces 1115. Multiple first spaces 1115 defined in a same first part 1113 are arranged at intervals. Each of the L first parts 1113 can define the same or different number of first spaces 1115.

In sum, the M first wires 1111 have the L first parts 1113, and the L first parts 1113 define the at least one first space 1115, implementations of which include, but are not limited to the following.

In an implementation, there are multiple first wires 1111 and multiple second wires 1121, and each of the first wires 1111 has multiple first parts 1113. Each of the multiple first parts 1113 defines one first space 1115.

In an implementation, there are multiple first wires 1111 and multiple second wires 1121, and each of the first wires 1111 has multiple first parts 1113. Each of the multiple first parts 1113 defines multiple first spaces 1115.

In an implementation, there are multiple first wires 1111 and multiple second wires 1121, and each of the first wires 1111 has multiple first parts 1113. Each of the first wires 1111 defines one first space 1115.

In an implementation, there are one first wire 1111 and multiple second wires 1121, and the first wire 1111 has multiple first parts 1113. Each of the multiple first parts 1113 defines one first space 1115.

In the implementation, referring to FIG. 8 again, the first space 1115 has a hole structure. A central axis of the hole structure is perpendicular to the first wiring layer 111. In this way, the overlap area between the projections of the first parts 1113 on the dielectric layer 113 and the projections of the second wires 1121 on the dielectric layer 113 is reduced. That is to say, the overlap area between the first wires 1111 and the second wires 1121 in the Z direction is reduced, and thus planar capacitances between the first parts 1113 of the first wires 1111 and the second wires 1121 are reduced. Furthermore, the hole structure is an enclosed structure, and the planar capacitances between the first parts 1113 of the first wires 1111 and the second wires 1121 are further reduced according to an electric-field shielding principle. As such, the transmission unit has a reduced resistance-capacitance, and the display panel has an improved display performance.

Figure 9:
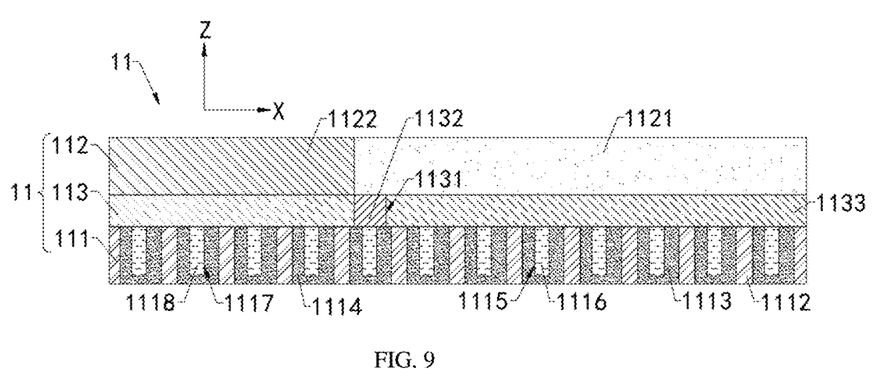
FIG. 9 is a schematic diagram illustrating the wiring unit illustrated in FIG. 8 in another implementation.

In an implementation, referring to FIG. 9, FIG. 9 is a schematic diagram illustrating the wiring unit 11 illustrated in FIG. 8 in another implementation. The first space 1115 may also have a groove structure. The first space 1115 has an opening towards the second wire 1121. It can be understood that, compared with the hole structure, the groove structure can enable a better strength of the first wires 1111. Moreover, a thickness of the first part 1113 of the first wire 1111 is reduced in a direction perpendicular to the first wiring layer 111, such that a distance between the first part 1113 of the first wire 1111 and the corresponding second wire 1121 is reduced in the direction perpendicular to the first wiring layer 111, which can further reduce planar capacitances between the first parts 1113 of the first wires 1111 and the second wires 1121.

In an implementation, a dielectric is disposed in the first space 1115 to form a first filler 1116. As such, the first wires 1111 have better strengths, and the first wiring layer 111 has a more uniform overall strength. The first filler 1116 can be made of a common dielectric constant material such as $SiO_2$ and may also be made of an LK material, a ULK material, or an ELK material. In other implementations, the first space 1115 may also be not filled with a dielectric.

Referring to FIG. 7 and FIG. 8 again, the M first wires 1111 include K second parts 1114. Projections of the K second parts 1114 on the dielectric layer 113 and projections of the second wires 1121 on the dielectric layer 113 are non-overlapping. The K second parts 1114 can be understood as remaining parts of the M first wires 1111 except the L first parts 1113.

The K second parts 1114 define J second spaces 1117. J is an integer greater than or equal to 1. That is to say, the K second parts 1114 can define one second space 1117 and can also define multiple second spaces 1117. The multiple second spaces 1117 are arranged at intervals.

In an implementation, some of the K second parts 1114 each can define a second space 1117, and some of the K second parts 1114 can also define no second space 1117. In an implementation, one second part 1114 can define one second space 1117 and can also define multiple second spaces 1117. Each of the K second parts 1114 can define the same or different number of second spaces 1117.

A projection of at least one of the J second spaces 1117 on the dielectric layer 113 overlaps a projection of an extended line of one second wire 1121 on the dielectric layer 113. In an implementation, projections of all the J second spaces 1117 on the dielectric layer 113 overlap projections of extended lines of the second wires 1121 on the dielectric layer 113.

In an implementation, a second space 1117 is defined at each of overlapping positions between the projections of the extended lines of the N second wires 1121 on the dielectric layer 113 and projections of the M first wires 1111 on the dielectric layer 113. As such, the M first wires 1111 can have similar resistances, which facilitates to reduce driving signal delays between different first wires 1111 and thus improve a display performance of the display panel.

In an implementation, a second space 1117 is defined at each of overlapping positions between projections of extended lines of some of the N second wires 1121 on the dielectric layer 113 and the projections of the M first wires 1111 on the dielectric layer 113.

The second space 1117 may have a hole structure and may also have a groove structure. The shape of the second space 1117 can be the same as that of the first space 1115, such that a difference between impedances of the M first wires 1111 can be further reduced, which is conducive to reducing driving signal delays between different first wires 1111 and thus improving a display performance of the display panel. In other implementations, the shape of the second space 1117 can also be different from that of the first space 1115.

In the implementation, a dielectric is disposed in the second space 1117 to form a second filler 1118. As such, the first wires 1111 have better strengths, and the first wiring layer 111 has a more uniform overall strength. The second filler 1118 can be made of a common dielectric constant material such as $SiO_2$ and may also be made of an LK material, a ULK material, or an ELK material. In other implementations, the second space 1117 may also be not filled with a dielectric.

In an implementation, the second parts 1114 can also define no second space 1117.

Figure 10:
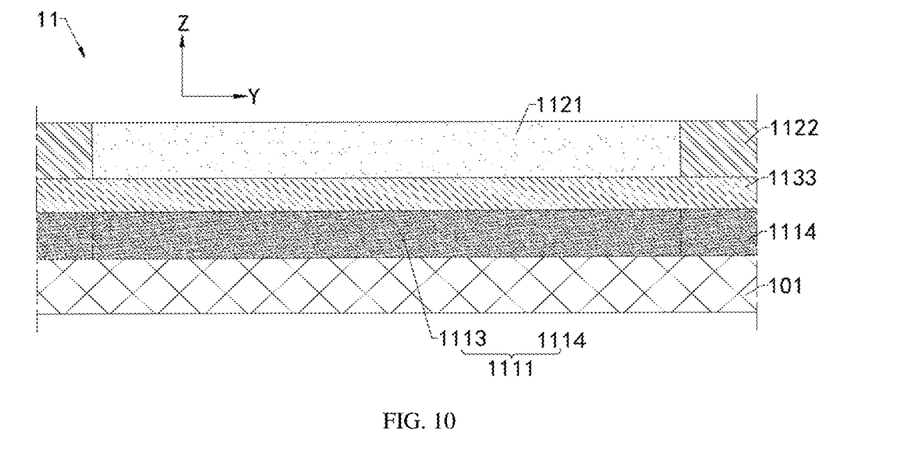
FIG. 10 is a schematic cross-sectional structural view of a part of the wiring unit illustrated in FIG. 4.
Figure 11:
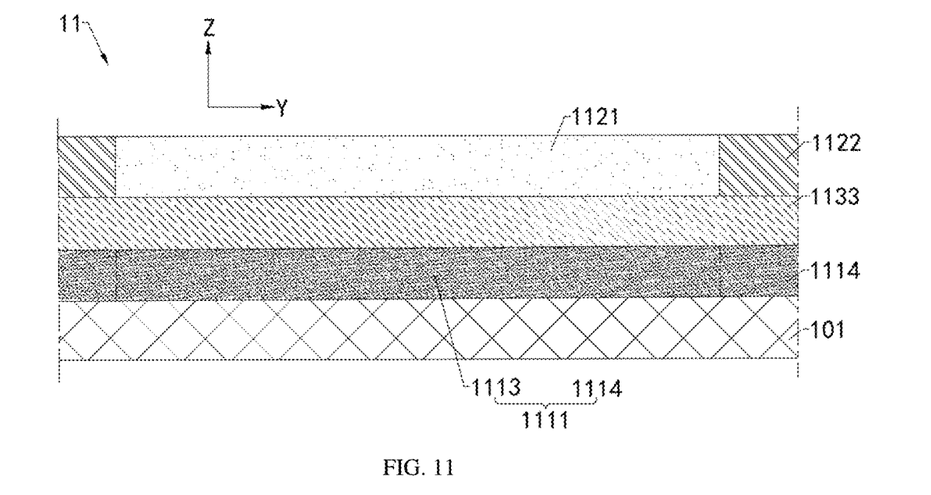
FIG. 11 is a schematic diagram illustrating a wiring unit in another implementation of the disclosure.

Referring to FIG. 10 and FIG. 11, FIG. 10 is a schematic cross-sectional structural view of a part of the wiring unit 11 illustrated in FIG. 4, and FIG. 11 is a schematic diagram illustrating a wiring unit 11 in another implementation of the disclosure. In an implementation, the dielectric layer 113 has a thickness ranging from 3850 Angstroms (Å) to 4350 Å. In the traditional technology, referring to FIG. 10, the thickness of the dielectric layer 113 generally ranges from 3350 Å to 3850 Å. According to a planar-capacitance forming principle, in the disclosure, a distance between the first wires 1111 and the second wires 1121 in the Z direction can be increased by increasing the thickness of the dielectric layer 113 (referring to FIG. 11), thereby reducing planar capacitances between the first wires 1111 and the second wires 1121. In an implementation, the thickness of the dielectric layer 113 is increased from 3500 Å to 4200 Å.

In an implementation, the thickness of the dielectric layer 113 can be increased, and in addition the first space 1115 can be defined. Taking two factors affecting planar capacitance into consideration, the planar capacitance can be further reduced by increasing the distance between the first wires 1111 and the second wires 1121 and at the same time reducing the overlap areas between the first wires 1111 and the second wires 1121. In an implementation, the thickness of the dielectric layer 113 can be increased, and in addition the first space 1115 and the second space 1117 can be defined.

In an implementation, a thickness of the insulating layer can also be increased, such that a distance between different wiring units 11 in the Z direction can be increased, and planar capacitances between first wires 1111 and second wires 1121 of different wiring units 11 can be reduced. In an implementation, the dielectric layer 113 and the insulating layer are gate insulating layers. The wiring units 11 are disposed on a glass substrate 101 of a TFT substrate.

Figure 12:
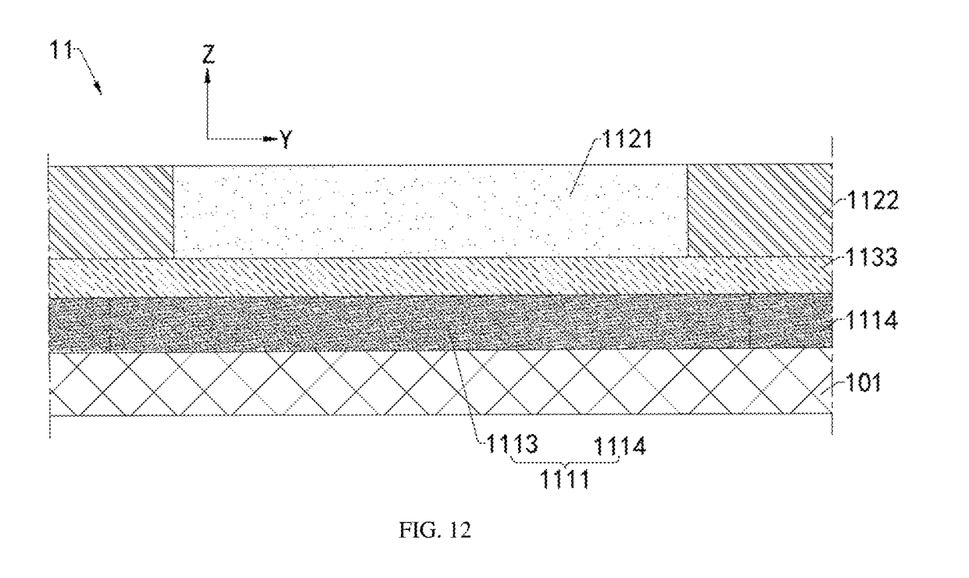
FIG. 12 is a schematic diagram illustrating a wiring unit in yet another implementation of the disclosure.

Referring to FIG. 12, FIG. 12 is a schematic diagram illustrating a wiring unit 11 in yet another implementation of the disclosure. In an implementation, each of the second wires 1121 has a line width ranging from 10 microns (μm) to 13 μm (referring to FIG. 12). In the traditional technology (referring to FIG. 10), the line width of the second wire 1121 ranges from 15 μm to 20 μm. According to the planar-capacitance forming principle, planar capacitances between the first wires 1111 and the second wires 1121 can be further reduced by reducing the line width of the second wire 1121 in the disclosure. In an implementation, the line width of the second wire 1121 is reduced from 15 μm to 13 μm.

In an implementation, the second wire 1121 has a line width ranging from 10 μm to 13 μm and a thickness ranging from 4450 Å to 5000 Å. In the traditional technology (referring to FIG. 10), the thickness of the second wire 1121 ranges from 3800 Å to 4350 Å. A cross-sectional area of the second wire 1121 is maintained to be unchanged or increased by reducing the line width of the second wire 1121 and at the same time increasing the thickness of the second wire 1121, thereby avoiding increase of resistances due to reduction of the line width of the second wire 1121. In an implementation, the line width of the second wire 1121 is reduced from 15 µm to 13 µm, and the thickness of the second wire 1121 is increased from 4350 Å to 5000 Å. In an implementation, the line width of the first wire can also be reduced and at the same time the thickness of the first wire can also be increased.

A low-impedance display panel and a display screen are provided in embodiments of the disclosure.

In a first aspect, a display panel is provided in the disclosure. The display panel includes a transmission unit and a display unit. The transmission unit is electrically coupled with the display unit. The transmission unit is configured to transmit a driving signal to the display unit, such that the display unit displays an image. The transmission unit includes a first wiring layer, a second wiring layer, and a dielectric layer. The dielectric layer is located between the first wiring layer and the second wiring layer. The first wiring layer is provided with M first wires. The second wiring layer is provided with N second wires. The M first wires have L first parts. Projections of the L first parts on the dielectric layer overlap projections of the second wires on the dielectric layer. The first wires are electrically coupled with the display unit via the second wires. M, N, and L each are an integer greater than or equal to 1. The L first parts define at least one first space.

In a possible implementation, the first space has a hole or groove structure.

In a possible implementation, each of the number of the first wires and the number of the second wires is multiple, and each of the first wires has at least one first part and is provided with at least one first space.

In a possible implementation, the M first wires include K second parts. The second parts are connected with the first parts. Projections of the second parts on the dielectric layer and projections of the second wires on a first dielectric layer are non-overlapping. The K second parts define J second spaces. A projection of at least one of the J second spaces on the dielectric layer overlaps one of projections of extended lines of the second wires on the dielectric layer. K and J each are an integer greater than or equal to 1.

In a possible implementation, projections of the J second spaces on the dielectric layer overlap the projections of the extended lines of the second wires on the dielectric layer.

In a possible implementation, the dielectric layer has a thickness ranging from 3850 Angstroms (Å) to 4350 Å.

In a possible implementation, each of the second wires has a line width ranging from 10 microns (µm) to 13 µm and a thickness ranging from 4450 Å to 5000 Å.

In a possible implementation, the first wiring layer, the dielectric layer, and the second wiring layer constitute a wiring unit, and the number of the wiring unit is multiple. The transmission unit further includes at least one insulating layer. The wiring units and the at least one insulating layer are alternately stacked in sequence. The at least one insulating layer is located between two adjacent wiring units, such that the two adjacent wiring units are insulated from each other.

In a possible implementation, the M first wires include one or more of a Clock (CLK) signal wire, a Start Vertical (STV) signal wire, a Reset (RST) signal wire, and a Vgatelow (VGL) signal wire.

In a second aspect, a display screen is provided in the disclosure. The display screen includes a backlight module and a display panel. The backlight module is configured to provide a backlight source for the display panel.

It can be understood that, the M first wires have the L first parts, the projections of the first parts on the dielectric layer overlap the projections of the second wires on the dielectric layer, and the first parts define the at least one first space, which can reduce overlap areas between the first wires and the second wires, and can also reduce planar capacitances between the first wires and the second wires. As such, the transmission unit has a reduced impedance, and the display panel has an improved display performance.

The above are merely specific implementations of the disclosure, the protection scope of the disclosure is not limited herein, and any variation or substitution readily conceivable by any person skilled in the art within the scope of the technology disclosed in the disclosure shall be covered by the protection scope of the disclosure. Various implementations and/or technical features of the various implementations may be implemented in any combination with each other without conflict. Therefore, the protection scope of the disclosure shall be subject to the protection scope of the claims.

What is claimed is:

1. A display panel, comprising:
    a transmission unit configured to transmit a driving signal and comprising:
        a first wiring layer provided with M first wires, wherein the M first wires have L first parts and the L first parts define at least one first space;
        a second wiring layer provided with N second wires; and
        a dielectric layer located between the first wiring layer and the second wiring layer; and
    a display unit electrically coupled with the transmission unit and configured to receive the driving signal from the transmission unit and display an image according to the driving signal, wherein
    projections of the L first parts on the dielectric layer overlap projections of the second wires on the dielectric layer, the first wires are electrically coupled with the display unit via the second wires, and M, N, and L each are an integer greater than or equal to 1.

2. The display panel of claim 1, wherein the at least one first space each has a hole or groove structure.

3. The display panel of claim 1, wherein M and N each are greater than 1, and each of the M first wires has at least one first part and defines at least one first space.

4. The display panel of claim 1, wherein the M first wires comprise K second parts, the second parts are connected with the L first parts, projections of the second parts on the dielectric layer and projections of the second wires on the dielectric layer are non-overlapping, the K second parts define J second spaces, a projection of at least one of the J second spaces on the dielectric layer overlaps one of projections of extended lines of the second wires on the dielectric layer, and K and J each are an integer greater than or equal to 1.

5. The display panel of claim 4, wherein projections of the J second spaces on the dielectric layer overlap the projections of the extended lines of the second wires on the dielectric layer.

6. The display panel of claim 4, wherein each of the J second spaces has a same shape as the at least one first space.

7. The display panel of claim 1, wherein the dielectric layer has a thickness ranging from 3850 Angstroms (Å) to 4350 Å.

8. The display panel of claim 1, wherein each of the second wires has a line width ranging from 10 microns (μm) to 13 μm and a thickness ranging from 4450 Å to 5000 Å.

9. The display panel of claim 1, wherein the transmission unit comprises a plurality of wiring units, each of the plurality of wiring units includes the first wiring layer, the dielectric layer, and the second wiring layer, wherein
the transmission unit further comprises at least one insulating layer, the wiring units and the at least one insulating layer are alternately stacked in sequence, and the at least one insulating layer is located between two adjacent wiring units, such that the two adjacent wiring units are insulated from each other.

10. The display panel of claim 1, wherein the M first wires comprise one or more of a Clock (CLK) signal wire, a Start Vertical (STV) signal wire, a Reset (RST) signal wire, and a Vgatelow (VGL) signal wire.

11. The display panel of claim 1, wherein the dielectric layer defines at least one through hole, and the first wires are electrically coupled with the second wires through a conducting material disposed in the at least one through hole.

12. The display panel of claim 11, wherein the conducting material is filled in the at least one through hole, or disposed at an inner wall of the at least one through hole.

13. The display panel of claim 11, wherein the first wiring layer is further provided with a first insulating medium that insulates the M first wires from each other, the second wiring layer is further provided with a second insulating medium that insulates the N second wires from each other, the dielectric layer is further provided with a third insulating medium that insulates the first wiring layer from the second wiring layer, and the first insulating medium, the second insulating medium, and the third insulating medium are made of a same material.

14. A display screen, comprising:
a display panel comprising:
  a transmission unit configured to transmit a driving signal and comprising:
    a first wiring layer provided with M first wires, wherein the M first wires have L first parts and the L first parts define at least one first space;
    a second wiring layer provided with N second wires; and
    a dielectric layer located between the first wiring layer and the second wiring layer; and
  a display unit electrically coupled with the transmission unit and configured to receive the driving signal from the transmission unit and display an image according to the driving signal, wherein
  projections of the L first parts on the dielectric layer overlap projections of the second wires on the dielectric layer, the first wires are electrically coupled with the display unit via the second wires, and M, N, and L each are an integer greater than or equal to 1; and
a backlight source configured to provide backlight for the display panel.

15. The display screen of claim 14, wherein the at least one first space each has a hole or groove structure.

16. The display screen of claim 14, wherein M and N each are greater than 1, and each of the M first wires has at least one first part and defines at least one first space.

17. The display screen of claim 14, wherein the M first wires comprise K second parts, the second parts are connected with the first parts, projections of the second parts on the dielectric layer and projections of the second wires on the dielectric layer are non-overlapping, the K second parts define J second spaces, a projection of at least one of the J second spaces on the dielectric layer overlaps one of projections of extended lines of the second wires on the dielectric layer, and K and J each are an integer greater than or equal to 1.

18. The display screen of claim 17, wherein projections of the J second spaces on the dielectric layer overlap the projections of the extended lines of the second wires on the dielectric layer.

19. The display screen of claim 17, wherein each of the J second spaces has a same shape as the at least one first space.

20. The display screen of claim 14, wherein the dielectric layer has a thickness ranging from 3850 Angstroms (Å) to 4350 Å.

* * * * *